United States Patent

Misumi et al.

(10) Patent No.: US 10,466,293 B2
(45) Date of Patent: Nov. 5, 2019

(54) INSPECTION DEVICE, CONTROL METHOD FOR SAME, AND NON-TRANSITORY COMPUTER READABLE STORAGE MEDIUM

(71) Applicant: OMRON Corporation, Kyoto (JP)

(72) Inventors: Shuichi Misumi, Kyoto (JP); Akihiko Sano, Uji (JP)

(73) Assignee: OMRON Corporation, Kyoto (JP)

( * ) Notice: Subject to any disclaimer, the term of this patent is extended or adjusted under 35 U.S.C. 154(b) by 7 days.

(21) Appl. No.: 15/750,204

(22) PCT Filed: Nov. 25, 2016

(86) PCT No.: PCT/JP2016/085019
§ 371 (c)(1),
(2) Date: Feb. 5, 2018

(87) PCT Pub. No.: WO2017/154277
PCT Pub. Date: Sep. 14, 2017

(65) Prior Publication Data
US 2018/0356453 A1 Dec. 13, 2018

(30) Foreign Application Priority Data
Mar. 8, 2016 (JP) .................... 2016-044780

(51) Int. Cl.
*G01R 27/26* (2006.01)
*G01R 31/02* (2006.01)
(Continued)

(52) U.S. Cl.
CPC ........... *G01R 31/026* (2013.01); *G01R 27/16* (2013.01); *G01R 27/2605* (2013.01);
(Continued)

(58) Field of Classification Search
CPC ...... G01R 31/40; G01R 31/42; G01R 31/405; G01R 31/024; G01R 31/025;
(Continued)

(56) References Cited

U.S. PATENT DOCUMENTS

2014/0062500 A1* 3/2014 Behrends ............. G01R 31/024
324/537
2014/0253138 A1* 9/2014 Ishii ..................... H02H 3/16
324/509
(Continued)

FOREIGN PATENT DOCUMENTS

JP 2005-106747 4/2005
JP 2010-57290 3/2010
(Continued)

OTHER PUBLICATIONS

"International Search Report (Form PCT/ISA/210) of PCT/JP2016/085019", dated Feb. 21, 2017, with English translation thereof, pp. 1-2.
(Continued)

Primary Examiner — Thang X Le
(74) Attorney, Agent, or Firm — JCIPRNET

(57) ABSTRACT

Provided is an inspection device that can determine by itself whether a power-supply-side circuit (11, 22, 23) including a solar-cell string (11) is electrically isolated from a PCS (13, 130). The inspection device (14, 140) measures the impedance of the power-supply-side circuit including the solar-cell string (11) and determines whether the power-supply-side circuit is electrically isolated from the PCS (13, 130) on the basis of the capacitive component of the measured impedance.

10 Claims, 6 Drawing Sheets

(51) Int. Cl.
　　　*H02S 50/10*　　　(2014.01)
　　　*G01R 27/16*　　　(2006.01)
　　　*H02S 50/00*　　　(2014.01)

(52) U.S. Cl.
　　　CPC ............ *G01R 31/025* (2013.01); *H02S 50/00* (2013.01); *H02S 50/10* (2014.12)

(58) Field of Classification Search
　　　CPC ..... G01R 31/2605; G01R 31/08; H02S 50/10; H02S 40/34; H02S 40/30; H02S 40/32; H01L 31/042; H01L 31/02021; H02C 3/08; H02J 3/38; H02J 3/385
　　　See application file for complete search history.

(56) References Cited

U.S. PATENT DOCUMENTS

| 2015/0015298 | A1 | 1/2015 | Merz et al. |
| 2015/0054523 | A1 | 2/2015 | Perkinson |
| 2015/0188487 | A1* | 7/2015 | Yoshidomi ............. H02S 50/10 324/761.01 |
| 2016/0226256 | A1* | 8/2016 | Falk .................. H01L 31/02021 |
| 2016/0329715 | A1* | 11/2016 | Orr ......................... H02J 3/383 |

FOREIGN PATENT DOCUMENTS

| JP | 2012-119382 | 6/2012 |
| JP | 2014-134445 | 7/2014 |

OTHER PUBLICATIONS

"Written Opinion of the International Searching Authority (Form PCT/ISA/237)" of PCT/JP2016/085019, dated Feb. 21, 2017, with English translation thereof, pp. 1-6.

"Search Report of Europe Counterpart Application," dated Jun. 26, 2019, p. 1-p. 6.

* cited by examiner

INSPECTION DEVICE, CONTROL METHOD FOR SAME, AND NON-TRANSITORY COMPUTER READABLE STORAGE MEDIUM

CROSS-REFERENCE TO RELATED APPLICATION

This application is a 371 of international application of PCT application serial no. PCT/JP2016/085019, filed on Nov. 25, 2016, which claims the priority benefit of Japan application no. 2016-044780, filed on Mar. 8, 2016. The entirety of each of the above-mentioned patent applications is hereby incorporated by reference herein and made a part of this specification.

BACKGROUND

Technical Field

The invention relates to an inspection device that performs inspection in a power supply system including a DC power source such as a solar power generation system.

Description of Related Art

A solar power generation system includes a plurality of solar cell strings and each solar cell string has a configuration in which a plurality of solar cell modules are connected in series. DC power generated from each solar cell string is converted into AC power by a power conditioning system (hereinafter abbreviated to PCS) and is supplied to a commercial power system or the like.

In such the solar power generation system, an inspection of the solar cell strings is performed to safely and stably supply the electric power. Examples of the inspection include an inspection of whether there is a disconnection fault and an inspection of whether there is a ground fault.

For example, Patent Document 1 discloses a ground fault detecting device that inspects whether there is a ground fault of the solar cell string in the solar power generation system including a plurality of the solar cell strings. In the ground fault detecting device, it is inspected whether there is the ground fault of the solar cell string in a state in which the solar cell string to be inspected is detached from the solar power generation system, that is, the solar cell string is electrically separated from a PCS by a switch unit disposed between the solar cell strings and the PCS. Accordingly, it is possible to prevent an adverse influence of noise which is generated due to the PCS from causing detection of a ground fault.

CITATION LIST

Patent Literature

Patent Document 1: Japanese Patent Application Laid-Open (JP-A) No. 2012-119382 (published on Jun. 21, 2012)

SUMMARY

Technical Problem

The ground fault detecting device described in Patent Document 1 is a stationary type that is fixed to the solar power generation system, and thus can have the switch unit incorporated thereinto. However, it is difficult to incorporate the switch unit into a portable inspection device.

Therefore, when such the portable inspection device is used, the solar cell string and the PCS are electrically separated from each other using a switch unit or a cutoff mechanism that is disposed in a fixed device other than the inspection device, such as a junction box or a PCS. However, in this case, it is necessary to confirm the separation from the fixed device, which requires labor.

The invention is made in consideration of the above-mentioned problem and an object thereof is to provide an inspection device that can determine whether a power source-side circuit including a DC power source such as a solar cell string is electrically separated from a power converter such as a PCS by itself.

Solution to Problem

In order to achieve the above-mentioned object, according to an aspect of the invention, there is provided an inspection device that inspects a first power source-side circuit in a power supply system including the first power source-side circuit including a first DC power source that generates electric power or performs charging/discharging, a power converter that converts the electric power supplied from the first power source-side circuit, and a first cutoff mechanism that cuts off electrical connection between the first power source-side circuit and the power converter, the inspection device including: a measurement unit that measures an impedance of the first power source-side circuit; and a first separation determining unit that determines whether the first power source-side circuit is electrically separated from the power converter by the first cutoff mechanism on the basis of a capacitive component of the impedance measured by the measurement unit.

In order to achieve the above-mentioned object, according to another aspect of the invention, there is provided a control method of an inspection device that inspects a first power source-side circuit in a power supply system including the first power source-side circuit including a first DC power source that generates electric power or performs charging/discharging, a power converter that converts the electric power supplied from the first power source-side circuit, and a first cutoff mechanism that cuts off electrical connection between the first power source-side circuit and the power converter, the control method including: a measurement step of measuring an impedance of the first power source-side circuit; and a first separation determining step of determining whether the first power source-side circuit is electrically separated from the power converter by the first cutoff mechanism on the basis of a capacitive component of the impedance measured by the measurement step.

Advantageous Effects of Invention

According to the configurations of the aspects of the invention, it is possible to allow the inspection device to measure an impedance of the first power source-side circuit and to determine whether the first power source-side circuit is electrically separated from the power converter from a capacitive component of the measured impedance.

DESCRIPTION OF THE EMBODIMENTS

Hereinafter, embodiments of the invention will be described in detail. For the purpose of convenience of explanation, members having the same functions as members described in the embodiments will be referenced by the same reference signs and description thereof will be appropriately omitted.

[First Embodiment]
(Outline of Solar Power Generation System)

Figure 1:
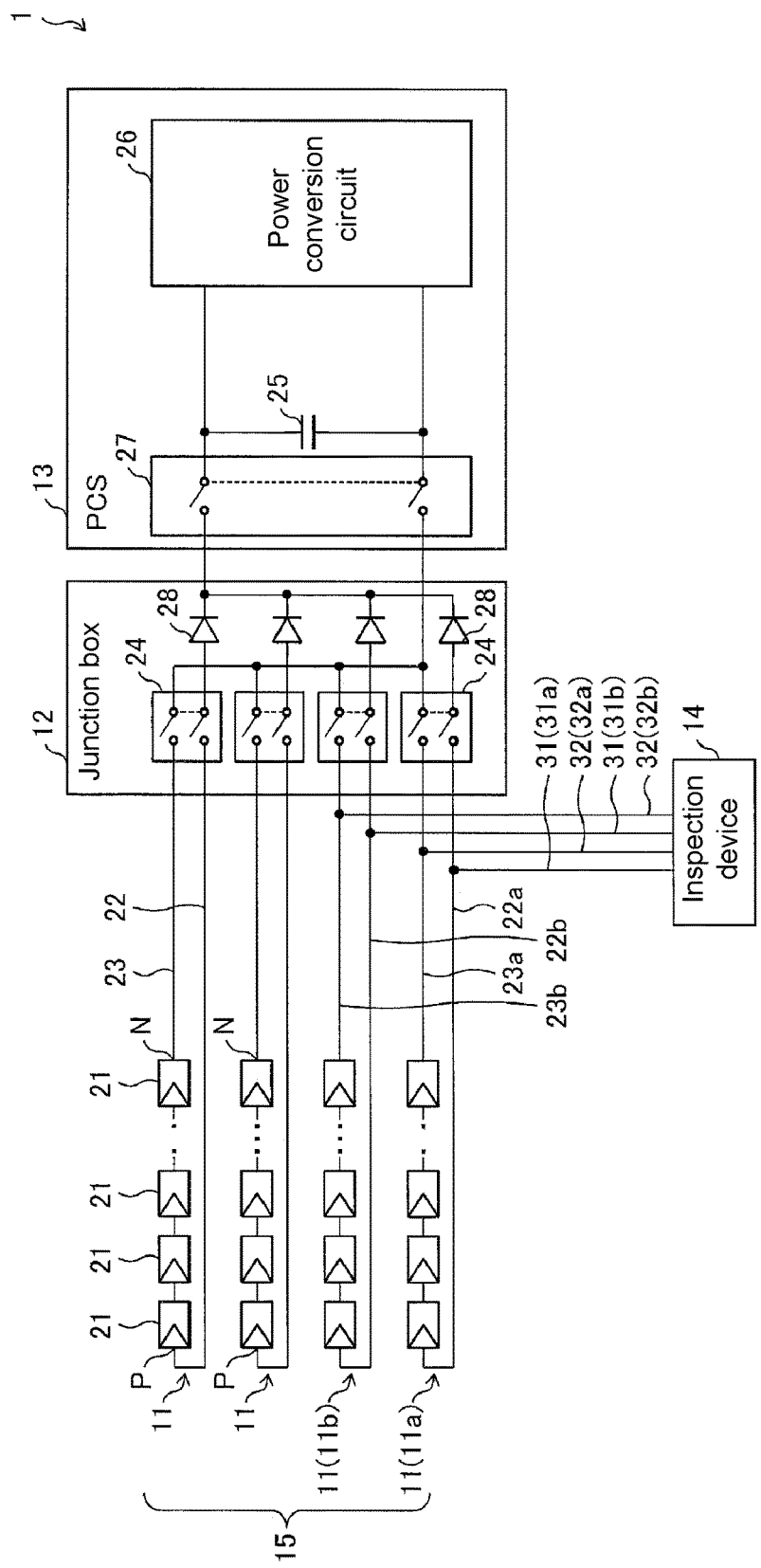
FIG. 1 is a circuit diagram schematically illustrating a configuration of a solar power generation system including an inspection device according to an embodiment of the invention.

FIG. 1 is a circuit diagram schematically illustrating a configuration of a solar power generation system including an inspection device according to an embodiment of the invention. As illustrated in FIG. 1, a solar power generation system (a power supply system) 1 includes a plurality of solar cell strings (a DC power source, a power source-side circuit) 11, a junction box 12, a power conditioning system (PCS) (power converter) 13, and an inspection device 14.

In each solar cell string 11, a plurality of solar cell modules 21 are connected in series. Each solar cell module 21 includes a plurality of solar cells (not illustrated) which are connected in series and is formed in a panel shape. The plurality of solar cell strings 11 constitute a solar cell array 15. Each solar cell string 11 is connected to the PCS (a power converter) 13 via the junction box 12.

A switch circuit (a first cutoff mechanism and a second cutoff mechanism) 24 that electrically separates each solar cell string 11 from the solar power generation system 1 is provided in the junction box 12. It is preferable that a backflow-prevention diode 28 is provided in any one of the output lines 22 and 23 (the output lines 22 in the example illustrated in FIG. 1).

The PCS 13 converts DC power input from the solar cell strings 11 into AC power and outputs the AC power to an external power system. Specifically, a large-capacitance capacitor 25 that stabilizes the electric power from the solar cell array 15 and a power conversion circuit 26 that converts the electric power into predetermined DC power or AC power are provided in the PCS 13. A switch circuit (a first cutoff mechanism) 27 that electrically separates the PCS 13 from the solar cell array 15 and the junction box 12 is provided in the PCS 13.

The inspection device 14 inspects the solar cell strings 11. Examples of the inspection include a disconnection inspection of inspecting whether there is a disconnection fault, a ground inspection of inspecting whether there is a ground fault, and a disconnection inspection that inspecting whether there is a disconnection fault in a bypass diode installed in each solar cell module 21. Specifically, the inspection device 14 includes two probes 31 and 32, and tips of the two probes 31 and 32 are attached to output lines 22 and 23 connected to the solar cell strings 11 to be inspected. Accordingly, the inspection device 14 can inspect the solar cell string 11 as an inspection object.

In this embodiment, the inspection device 14 includes two pairs of two probes 31 and 32. That is, the inspection device 14 includes a pair of probes 31a and 32a and another pair of probes 31b and 32b. Accordingly, the inspection device can inspect two solar cell strings 11a and 11b.

(Configuration of Inspection Device 14)

Figure 2:
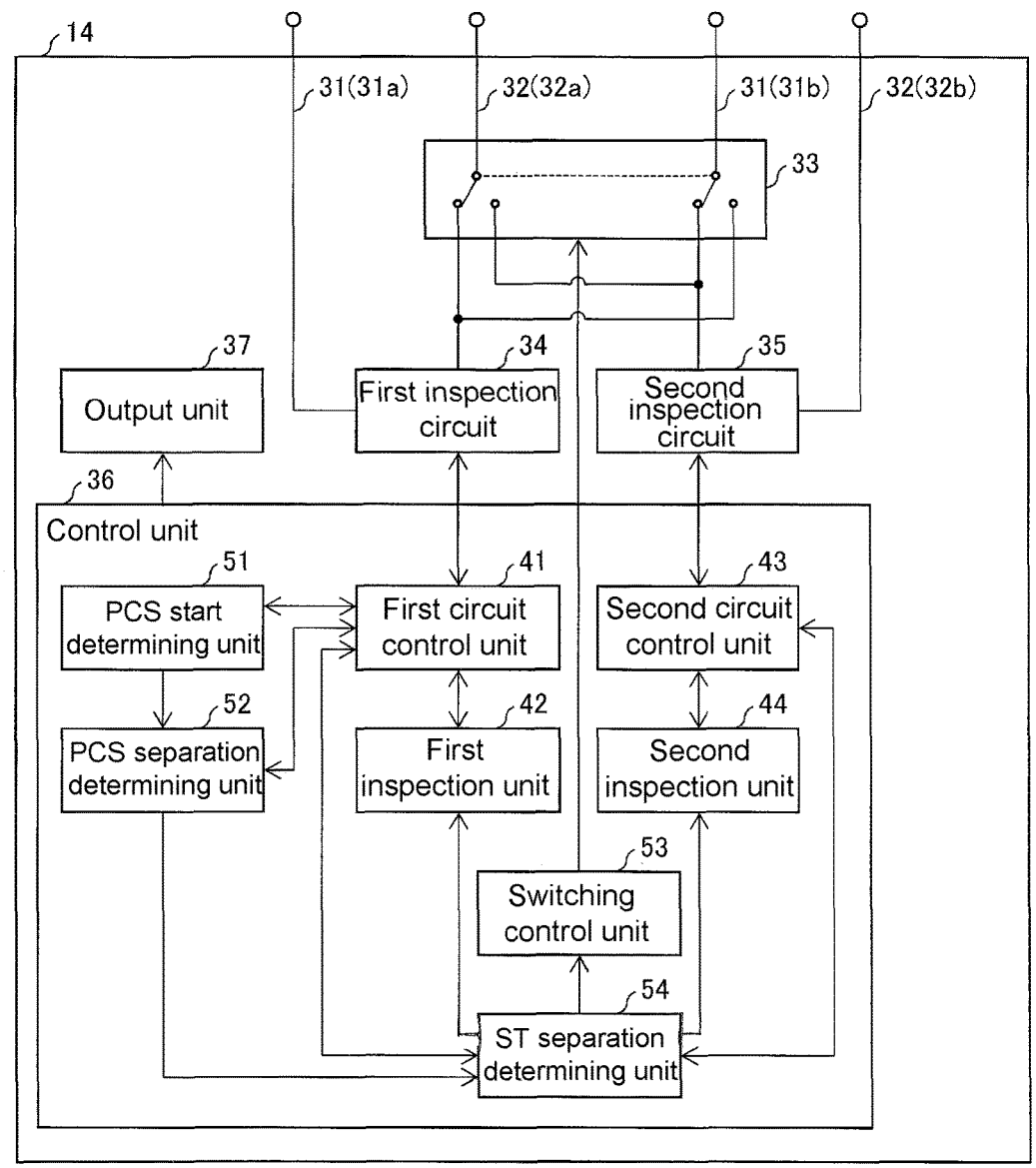
FIG. 2 is a block diagram illustrating a configuration of the inspection device.

FIG. 2 is a block diagram illustrating a configuration of the inspection device 14. As illustrated in FIG. 2, the inspection device 14 includes a switch circuit 33, a first inspection circuit 34, a second inspection circuit 35, a control unit 36, and an output unit 37 in addition to the above-mentioned probes 31 and 32.

The probe 31a is connected to the first inspection circuit 34, and the probe 32a is connected to the switch circuit 33. The probe 31b is connected to the switch circuit 33, and the probe 32b is connected to the second inspection circuit 35.

The switch circuit 33 switches a connection state of the probe 32a and 31b between a first connection state and a second connection state on the basis of an instruction from the control unit 36. In the first connection state, the probe 32a is connected to the first inspection circuit 34 via the switch circuit 33, and the probe 31b is connected to the second inspection circuit 35 via the switch circuit 33. On the other hand, in the second connection state, the probe 32a is connected to the second inspection circuit 35 via the switch circuit 33, and the probe 31b is connected to the first inspection circuit 34 via the switch circuit 33.

Accordingly, in the first connection state, the first inspection circuit 34 is connected to the output lines 22a and 23a from one solar cell string (a first DC power source) 11a via a pair of probes 31a and 32a. Accordingly, the first inspection circuit 34 inspects the first power source-side circuit including the solar cell string 11a and the output lines 22a and 23a.

The second inspection circuit 35 is connected to the output lines 22b and 23b from the other solar cell string (a second DC power source) 11b via another pair of probes 31b and 32b. Accordingly, the second inspection circuit 35 inspects the second power-source side circuit including the solar cell string 11b and the output lines 22b and 23b.

On the other hand, in the second connection state, the first inspection circuit 34 is connected to the output lines 22a and 22b from P terminals of both solar cell strings 11a and 11b via the probes 31a and 31b. The second inspection circuit 35 is connected to the output lines 23a and 23b from N terminals of both solar cell strings 11a and 11b via the probes 32a and 32b. In this embodiment, the connection state is normally set to the first connection state, and is switched to the second connection state in only a predetermined case which will be described later.

The first inspection circuit 34 is a circuit group that acquires measured values required for first inspection of the solar cell strings 11 in accordance with an instruction from the control unit 36. Specifically, the first inspection circuit 34 includes an introduction circuit that introduces a test signal into the connected output lines 22 and 23 and a detection circuit that detects electrical physical quantities as a response in the connected output lines 22 and 23.

The introduction circuit applies a voltage required for the first inspection or causes a current to flow. The voltage and the current may be DC or AC, and an AC frequency can be set to various values. The detection circuit detects electrical physical quantities required for the first inspection. Examples of the electrical physical quantities include a voltage between a positive electrode and a negative electrode of the solar cell string 11, a voltage between the positive electrode of the solar cell string 11 and a frame ground, a voltage between the negative electrode of the solar cell string 11 and the frame ground, and a power-generation current of the solar cell string 11.

The second inspection circuit 35 is a circuit group that acquires measured values required for second inspection of the solar cell strings 11 in accordance with an instruction from the control unit 36. The second inspection is different from the first inspection only in an inspection object, and both inspections have the same inspection contents. Accordingly, details of the second inspection circuit 35 will not be repeated.

The control unit 36 collectively controls operations of various elements of the inspection device 14 and is constituted, for example, by a computer including a central processing unit (CPU) and a memory. Operation control of each of the elements is performed by causing the computer to execute a control program. Details of the control unit 36 will be described later.

The output unit 37 outputs a variety of information on the basis of data from the control unit 36. Specifically, the output unit 37 displays a variety of information, outputs the information by sound, prints the information, records the information on a detachable recording medium, or transmits the information to an external device.

(Configuration of Control Unit 36)

As illustrated in FIG. 2, the control unit 36 includes a first circuit control unit 41, a first inspection unit 42, a second circuit control unit 43, and a second inspection unit 44. In this embodiment, the control unit 36 includes a PCS start determining unit (a start determining unit) 51, a PCS separation determining unit (a first separation determining unit) 52, a switching control unit 53, and an ST separation determining unit (a second separation determining unit) 54.

The first circuit control unit 41 controls the first inspection circuit 34 such that measured values required for inspection in the first inspection unit 42 are acquired. Specifically, the first circuit control unit 41 acquires electrical physical quantities detected by the first inspection circuit 34 as the measured values, or calculates the measured values using the electrical physical quantities. The first circuit control unit 41 may appropriately instruct the first inspection circuit 34 to introduce a test signal in order to acquire the measured values.

The first inspection unit 42 performs various inspections such as a disconnection inspection and a ground inspection on the output lines 22 and 23 and the solar cell string 11 of the inspection object by requiring and acquiring the necessary measured values to and from the first circuit control unit 41. The first inspection unit 42 outputs inspection results via the output unit 37. Details of the first inspection unit 42 are described in and known from Japanese Patent Application Laid-Open No. 2012-119382, Japanese Patent No. 4604250, Japanese Patent No 5196607, and Japanese Patent Application Laid-Open No. 2013-156125 and thus description thereof will not be performed herein.

The second circuit control unit 43 controls the second inspection circuit 35 such that measured values required for inspection in the second inspection unit 44 are acquired. Details of the second circuit control unit 43 are the same as the first circuit control unit 41 and thus description thereof will not be repeated.

The second inspection unit 44 performs the above-mentioned various inspections on the output lines 22 and 23 and the solar cell string 11 of the inspection object by requiring and acquiring the necessary measured values to and from the second circuit control unit 43. The second inspection unit 44 outputs inspection results via the output unit 37. Details of the second inspection unit 44 are known similarly to the first inspection unit 42 and thus description thereof will not be made herein.

The PCS start determining unit 51 determines whether the PCS 13 has started by requiring and acquiring the necessary measured values to and from the first circuit control unit 41. When the PCS has started, the PCS start determining unit 51 outputs information indicating that fact via the output unit 37. On the other hand, when the PCS has not started, the PCS start determining unit 51 notifies the PCS separation determining unit 52 of information indicating that fact. Details of the PCS start determining unit 51 will be described later.

The PCS separation determining unit 52 determines whether the output lines 22 and 23 and the solar cell string 11 of the inspection object are electrically separated from the PCS 13 by requiring and acquiring the necessary measured values to and from the first circuit control unit 41. When the output lines and the solar cell string are not electrically separated from the PCS, the PCS separation determining unit 52 outputs information indicating that fact via the output unit 37. On the other hand, when the output lines and the solar cell string are electrically separated from the PCS, the PCS separation determining unit 52 notifies the ST separation determining unit 54 of information indicating that fact. Details of the PCS separation determining unit 52 will be described later.

The switching control unit 53 controls the switch circuit 33 such that the connection state is switched between the first connection state and the second connection state in accordance with an instruction from the ST separation determining unit 54.

The ST separation determining unit 54 determines whether the output lines 22 and 23 and the solar cell strings 11 as two inspection objects are electrically separated from each other. Specifically, the ST separation determining unit 54 first instructs the switching control unit 53 to switch the switch circuit 33 from the first connection state to the second connection state. Then, the ST separation determining unit 54 performs the determination by requiring and acquiring the necessary measured values to and from the first circuit control unit 41 and the second circuit control unit 43.

When the output lines and the solar cell string are not electrically separated from each other, that is, when the output lines and the solar cell string are electrically connected to each other, the ST separation determining unit 54 outputs information indicating that fact via the output unit 37. On the other hand, when the output lines and the solar cell string are electrically separated from each other, the ST separation determining unit 54 instructs the first inspection unit 42 and the second inspection unit 44 to perform inspections. Thereafter, the ST separation determining unit 54 instructs the switching control unit 53 to switch the switch circuit 33 from the second connection state to the first connection state. Details of the ST separation determining unit 54 will be described later.

(Details of PCS Start Determining Unit 51 and PCS Separation Determining Unit 52)

Figure 3:
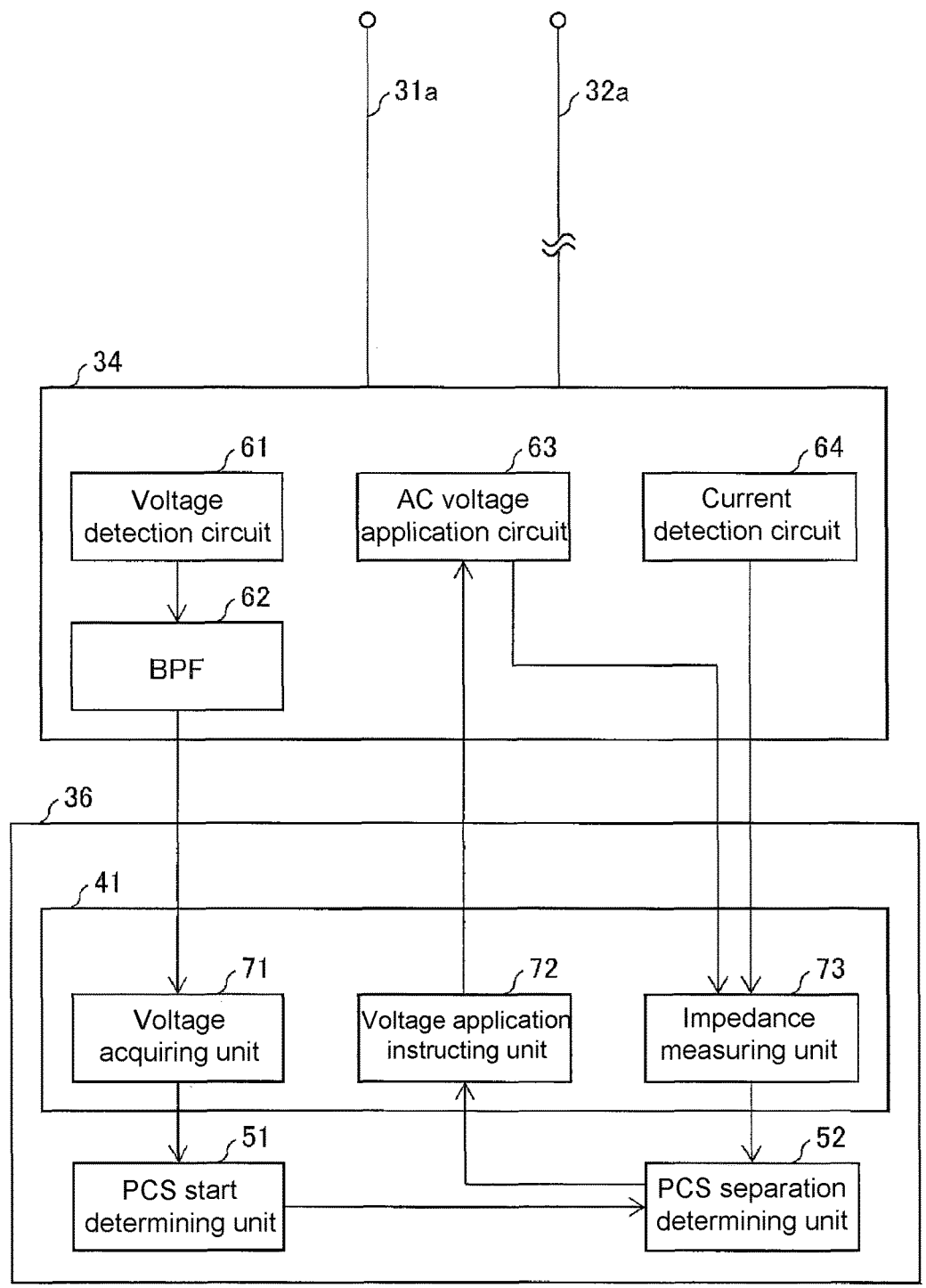
FIG. 3 is a block diagram illustrating a configuration of a PCS start determining unit and a PCS separation determining unit in the inspection device as a configuration of a first inspection circuit and a first circuit control unit in the inspection device.

FIG. 3 is a block diagram illustrating a configuration of the PCS start determining unit 51 and the PCS separation determining unit 52 as the configuration of the first inspection circuit 34 and the first circuit control unit 41.

The PCS start determining unit 51 determines whether the PCS 13 has started as described above. When the PCS 13 is started, a switching circuit built thereinto operates and thus switching noise of a specific frequency (for example, 10 kHz, 20 kHz, and 40 kHz) is generated. Accordingly, when the PCS 13 is connected to the output lines 22 and 23 as the inspection object and is started, the switching noise propagates to the output lines 22 and 23 as the inspection object and thus inspection accuracy in the inspection device 14 decreases.

Conversely, when the switching noise is detected in the output lines 22 and 23 as the inspection object, it can be determined that the PCS 13 is connected to the output lines 22 and 23 as the inspection object and the PCS 13 has started.

Therefore, in this embodiment, the PCS start determining unit 51 acquires a voltage of a frequency component corresponding to the switching noise among the voltages of the output lines 22 and 23 as the inspection object, and determines that the PCS 13 has started when the magnitude of the acquired voltage of the frequency component is equal to or greater than a predetermined value. Accordingly, the inspection device 14 can confirm whether the PCS 13 has started.

As described above, the PCS separation determining unit 52 determines whether the output lines 22 and 23 as the inspection object are electrically separated from the PCS 13. As described above, the PCS 13 includes the large-capacitance capacitor 25 that stabilizes electric power from the solar cell array 15. Accordingly, when the output lines 22 and 23 as the inspection object are connected to the PCS 13 (that is, when both are not electrically separated), the test signal introduced into the output lines 22 and 23 of the inspection object is absorbed by the large-capacitance capacitor 25 and thus inspection accuracy in the inspection device 14 decreases.

The capacitance of the large-capacitance capacitor 25 is about 1 mF, and the capacitive component in the output lines 22 and 23 and the solar cell string 11 is about 50 nF, which is markedly lower than the capacitance of the large-capacitance capacitor 25. Accordingly, when a capacitance of a circuit including the output lines 22 and 23 as the inspection object is detected, it can be determined whether the output lines 22 and 23 as the inspection object are electrically separated from the PCS 13.

Therefore, in this embodiment, the PCS separation determining unit 52 acquires the capacitance of the circuit including the output lines 22 and 23 as the inspection object and determines that the output lines 22 and 23 as the inspection object are electrically separated from the PCS 13 when the acquired capacitance is less than a predetermined value. Accordingly, the inspection device 14 can accurately confirm that the output lines 22 and 23 as the inspection object are electrically separated from the PCS 13.

As described above, the PCS start determining unit 51 and the PCS separation determining unit 52 use the measured values relevant to the output lines 22 and 23 as the inspection object. Accordingly, similarly to the first inspection unit 42 and the second inspection unit 44, the PCS start determining unit 51 and the PCS separation determining unit 52 operate in the first connection state in which the first inspection circuit 34 is connected to the output lines 22a and 23a via a pair of probes 31a and 32a and the second inspection circuit 35 is connected to the output lines 22b and 23b via another pair of probes 31b and 32b.

As illustrated in FIG. 3, the first inspection circuit 34 includes a voltage detection circuit 61, a band-pass filter (BPF) 62, an AC voltage application circuit 63, and a current detection circuit 64. The first circuit control unit 41 includes a voltage acquiring unit 71, a voltage application instructing unit 72, and an impedance measuring unit (a measurement unit) 73.

The voltage detection circuit 61 detects a voltage between two output lines (the output lines 22a and 23a in the example illustrated in FIG. 3) connected to the first inspection circuit 34. The voltage detection circuit 61 transmits a signal of the detected voltage to the BPF 62 and the impedance measuring unit 73.

The BPF 62 passes a signal of an AC voltage of a predetermined frequency band among signals of voltages detected by the voltage detection circuit 61. The BPF 62 sequentially transmits the passed signals of the AC voltages to the voltage acquiring unit 71. In this embodiment, the BPF 62 can switch the center frequency of the passable frequency band to 10 kHz, 20 kHz, and 40 kHz depending on the frequency generated in the PCS 13 at the time of starting.

The AC voltage application circuit 63 applies an AC voltage based on an instruction from the voltage application instructing unit 72 between two output lines (the output lines 22a and 23a in the example illustrated in FIG. 3) connected to the first inspection circuit 34. The AC voltage application circuit 63 transmits a signal of the applied AC voltage to the impedance measuring unit 73.

The current detection circuit 64 detects a current flowing in two output lines (the output lines 22a and 23a in the example illustrated in FIG. 3) connected to the first inspection circuit 34. The current detection circuit 64 transmits a signal of the detected current to the impedance measuring unit 73.

The voltage acquiring unit 71 sequentially acquires the signals of the AC voltage passing through the BPF 62. In this embodiment, the voltage acquiring unit 71 transmits time-series data of the acquired AC voltage to the PCS start determining unit 51.

The voltage application instructing unit 72 instructs the AC voltage application circuit 63 to apply an AC voltage between two output lines connected to the first inspection circuit 34. In this embodiment, the voltage application instructing unit 72 instructs the AC voltage application circuit 63 in accordance with an instruction from the PCS separation determining unit 52.

The impedance measuring unit 73 measures impedances of two output lines (the output lines 22a and 23a in the example illustrated in FIG. 3) connected to the first inspection circuit 34 using a voltage signal introduced (applied) by the AC voltage application circuit 63 and a current signal from the current detection circuit 64 (or a voltage signal from the voltage detection circuit 61). In this embodiment, the impedance measuring unit 73 transmits a capacitive component among the measured impedances to the PCS separation determining unit 52.

As described above, the PCS start determining unit 51 determines whether the PCS 13 has started on the basis of the time-series data of the AC voltages from the voltage acquiring unit 71 as described above, and notifies the PCS separation determining unit 52 of information indicating that fact when it is determined that the PCS has not started. For example, when a root mean square (RMS) value of the AC voltages passing through the BPF 62 is equal to or greater than 50 mV, the PCS start determining unit 51 determines that the PCS 13 has started. On the other hand, when the RMS value of the AC voltages is less than 50 mV, it is assumed that there is a high likelihood that mere noise in the air will be detected or that a measurement limit based on an S/N ratio will be reached, and thus the PCS start determining unit 51 determines that the PCS 13 has not started.

As described above, the PCS separation determining unit 52 determines whether the output lines 22a and 23a as the inspection object are electrically separated from the PCS 13 on the basis of the capacitive component of the impedance from the impedance measuring unit 73, and notifies the ST separation determining unit 54 of information indicating the fact when it is determined that the output lines are electrically separated from the PCS. For example, when the capacitive component is equal to or greater than 10 μF, the PCS separation determining unit 52 determines that the output lines 22a and 23a as the inspection object are not electrically separated from (that is, connected to) the PCS 13. On the other hand, when the capacitive component is less than 10 μF, the PCS separation determining unit 52 determines that the output lines 22a and 23a as the inspection object are electrically separated from the PCS 13.

(Details of ST Separation Determining Unit 54)

Figure 4:
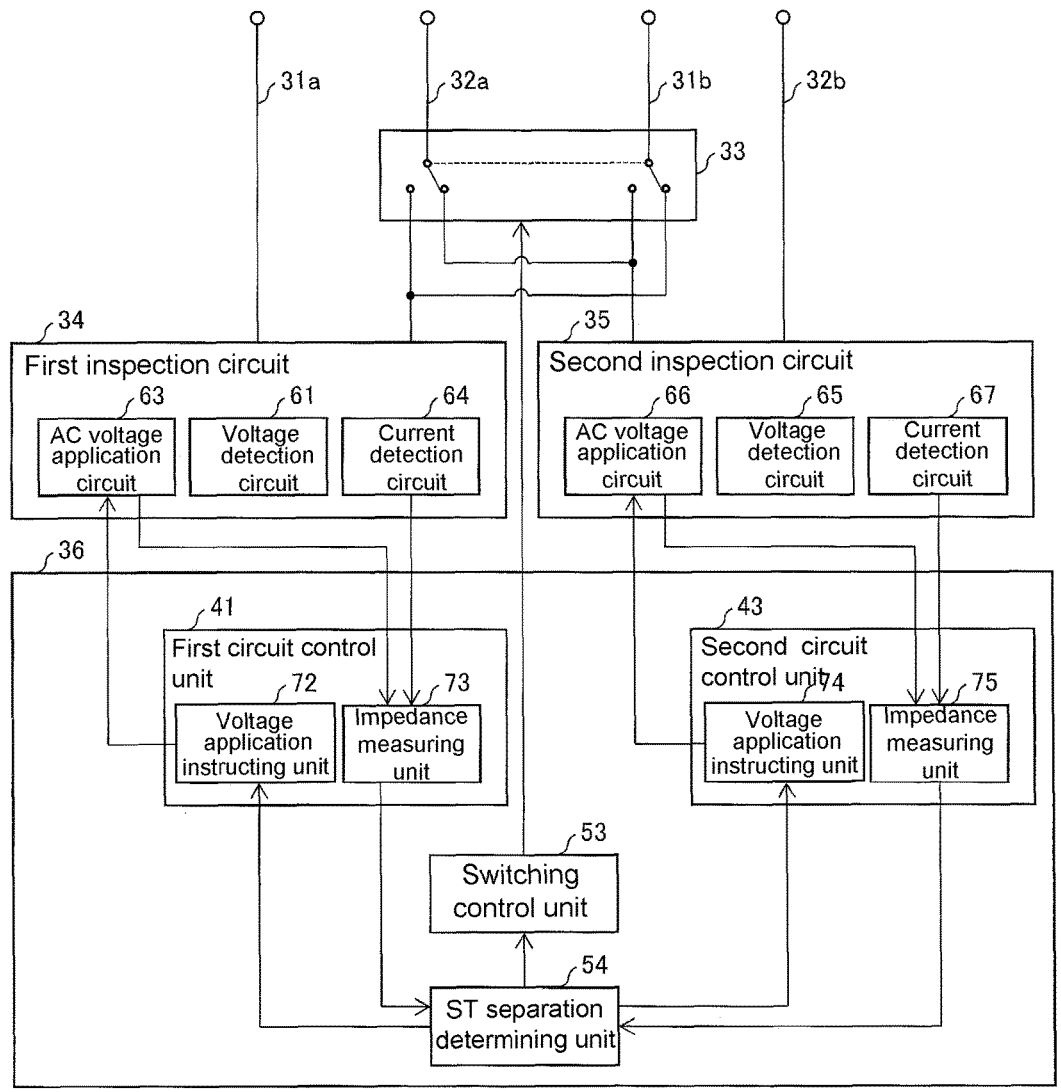
FIG. 4 is a block diagram illustrating a configuration of an ST separation determining unit in the inspection device as a configuration of the first inspection circuit, a second inspection circuit, the first circuit control unit, and a second circuit control unit in the inspection device.

FIG. 4 is a block diagram illustrating a configuration of the ST separation determining unit 54 as the configuration of the first inspection circuit 34, the second inspection circuit 35, the first circuit control unit 41, and the second circuit control unit 43.

As described above, the ST separation determining unit 54 determines whether the output lines 22 and 23 and the solar cell strings 11 as two inspection objects are electrically separated from each other. When the output lines 22 and 23 of two inspection objects are connected to each other (that is, not electrically separated from each other), the output lines 22a and 22b are brought into a conduction state and the output lines 23a and 23b are brought into a conduction state. In this case, the inspection device 14 can inspect the two inspection objects as a whole, but cannot individually inspect the two inspection objects.

Conversely, when the output lines 22a and 22b are electrically isolated and the output lines 23a and 23b are electrically isolated, it can be determined that the output lines 22 and 23 and the solar cell strings 11 as two inspection objects are electrically separated from each other.

Therefore, in this embodiment, the ST separation determining unit 54 acquires a resistive value between the output lines 22a and 22b and a resistive value between the output lines 23a and 23b, and determines that the output lines 22 and 23 and the solar cell strings 11 as two inspection objects are electrically separated from each other when both the acquired resistive values are equal to or greater than a predetermined value. Accordingly, the inspection device 14 can accurately confirm that the output lines 22 and 23 and the solar cell strings 11 as two inspection objects are electrically separated from each other.

As described above, the ST separation determining unit 54 acquires the resistive value between the output lines 22a and 22b and the resistive value between the output lines 23a and 23b. Accordingly, unlike the first inspection unit 42 and the second inspection unit 44, the ST separation determining unit 54 needs to operate in the second connection state in which the first inspection circuit 34 is connected to the output lines 22a and 22b via the probes 31a and 31b and the second inspection circuit 35 is connected to the output lines 23a and 23b via the probes 32a and 32b. Therefore, the ST separation determining unit 54 instructs the switching control unit 53 to switch the switch circuit 33 from the first connection state to the second connection state at the time of starting of the operation thereof. Then, when the operation ends, the ST separation determining unit 54 instructs the switching control unit 53 to switch the switch circuit 33 from the second connection state to the first connection state.

As illustrated in FIGS. 3 and 4, the first inspection circuit 34 includes the voltage detection circuit 61, the AC voltage application circuit 63, and the current detection circuit 64. As illustrated in FIG. 4, the second inspection circuit 35 includes a voltage detection circuit 65, an AC voltage application circuit 66, and a current detection circuit 67. The voltage detection circuit 65, the AC voltage application circuit 66, and the current detection circuit 67 are the same as the voltage detection circuit 61, the AC voltage application circuit 63, and the current detection circuit 64, respectively, and thus description thereof will not be repeated.

As illustrated in FIGS. 3 and 4, the first circuit control unit 41 includes the voltage application instructing unit 72 and the impedance measuring unit 73. As illustrated in FIG. 4, the second inspection circuit 35 includes a voltage application instructing unit 74 and an impedance measuring unit (a measurement unit) 75. The voltage application instructing unit 74 and the impedance measuring unit 75 are the same as the voltage application instructing unit 72 and the impedance measuring unit 73, respectively, and thus description thereof will not be repeated.

The ST separation determining unit 54 determines whether the output lines 22 and 23 and the solar cell strings 11 as two inspection objects are electrically separated from each other on the basis of the resistive value between the output lines 22a and 22b and the resistive value between the output lines 23a and 23b, and instructs the first inspection unit 42 and the second inspection unit 44 to perform inspections when it is determined that the output lines and the solar cell string are electrically separated.

In the example illustrated in FIG. 4, the ST separation determining unit 54 applies an AC voltage between the output lines 22a and 22b via the voltage application instructing unit 72 and the AC voltage application circuit 63 and acquires the resistive component of the impedance between the output lines 22a and 22b via the AC voltage application circuit 63, the current detection circuit 64 (or the voltage detection circuit 61), and the impedance measuring unit 73. Similarly, the ST separation determining unit 54 applies an AC voltage between the output lines 23a and 23b via the voltage application instructing unit 74 and the AC voltage application circuit 66 and acquires the resistive component of the impedance between the output lines 23a and 23b via the AC voltage application circuit 66, the current detection circuit 67 (or the voltage detection circuit 65), and the impedance measuring unit 75. When both of the acquired two resistive components are equal to or greater than, for example, 5Ω, the ST separation determining unit 54 determines that the output lines 22 and 23 and the solar cell strings 11 as two inspection objects are electrically separated from each other. On the other hand, when at least one of the two resistive components is less than, for example, 5Ω, the ST separation determining unit 54 determines that the output lines 22 and 23 and the solar cell strings 11 as two inspection objects are not electrically separated from each other (that is, connected to each other).

(Inspection Process of Inspection Device 14)

Figure 5:
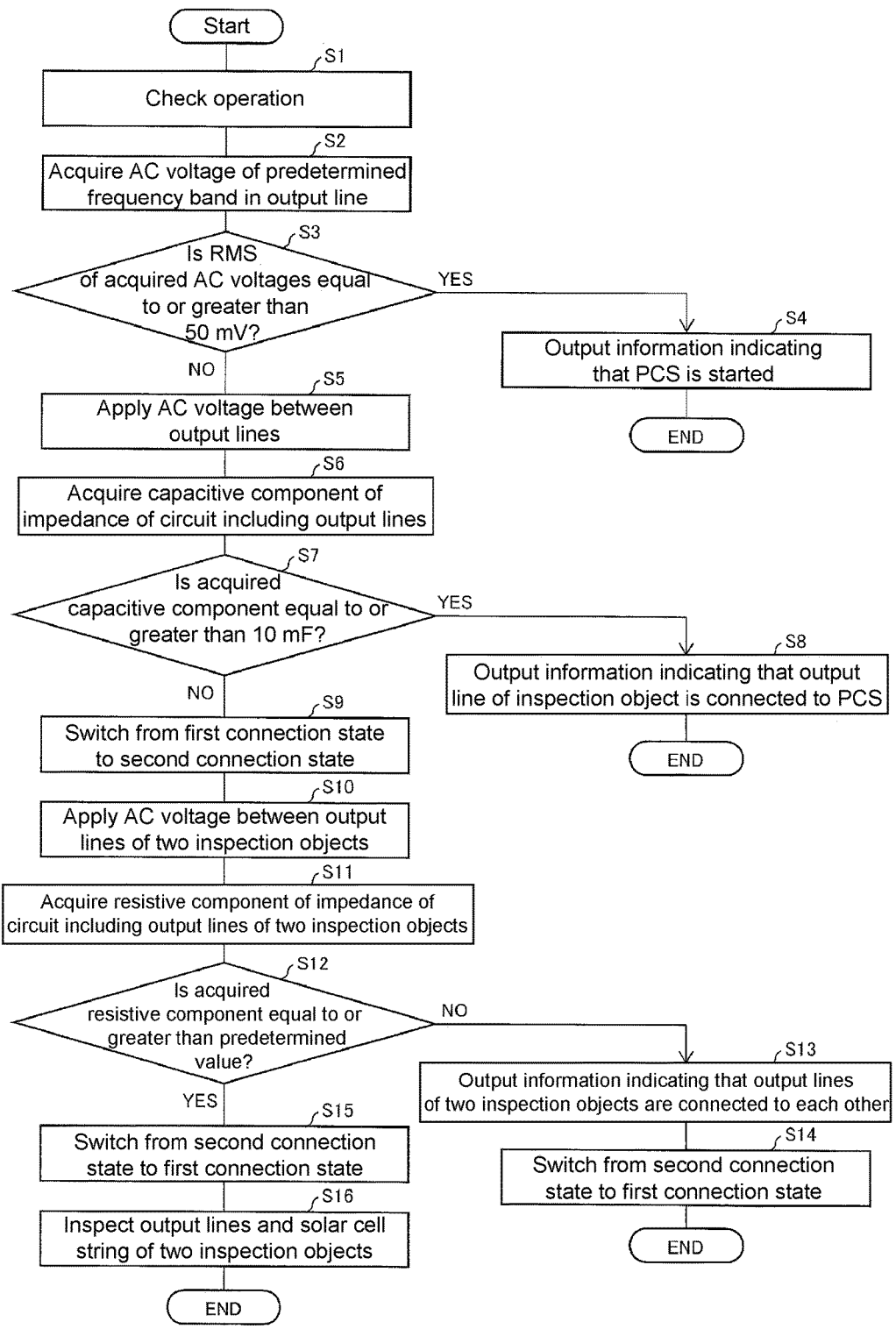
FIG. 5 is a flowchart illustrating a flow of an inspection process in the inspection device having the above-mentioned configuration.

FIG. 5 is a flowchart illustrating a flow of an inspection process in the inspection device 14 having the above-mentioned configuration. As illustrated in FIG. 5, first, operation of each unit is checked (S1). At this time, it is confirmed that the switch circuit 33 is in the first connection state.

Then, the PCS start determining unit 51 acquires AC voltages of a predetermined frequency band (10 kHz, 20 kHz, or 40 kHz) in the output lines 22a and 23a from the output lines 22a and 23a via the voltage detection circuit 61, the BPF 62, and the voltage acquiring unit 71 (S2). Then, the PCS start determining unit 51 determines whether the RMS of the acquired AC voltages is equal to or greater than 50 mV (S3). When the RMS of the AC voltages is equal to or greater than 50 mV, the PCS start determining unit 51 determines that the PCS 13 is started and outputs information indicating the fact via the output unit 37 (S4), and then the inspection process is ended.

On the other hand, when the RMS of the AC voltages is less than 50 mV, the PCS separation determining unit 52 applies an AC voltage between the output lines 22a and 23a via the voltage application instructing unit 72 and the AC voltage application circuit 63 (S5). Then, the PCS separation determining unit 52 acquires a capacitive component of an impedance in the circuit including the output lines 22 and 23 from the output lines 22a and 23a via the AC voltage application circuit 63, the current detection circuit 64 (or the voltage detection circuit 61), and the impedance measuring unit 73 (S6).

Then, the PCS separation determining unit 52 determines whether the acquired capacitive component is equal to or greater than 10 μF (S7). When the capacitive component is equal to or greater than 10 the PCS separation determining unit 52 determines that the output lines 22a and 23a of the inspection object are connected to the PCS 13 and outputs information indicating the fact via the output unit 37 (S8), and then the inspection process is ended.

On the other hand, when the capacitive component is less than 10 μF, the ST separation determining unit 54 causes the switch circuit 33 to switch from the first connection state to the second connection state via the switching control unit 53 (S9).

Then, the ST separation determining unit 54 applies an AC voltage between the output lines 22a and 22b via the voltage application instructing unit 72 and the AC voltage application circuit 63, and applies an AC voltage between the output lines 23a and 23b via the voltage application instructing unit 74 and the AC voltage application circuit 66 (S10). Then, the ST separation determining unit 54 acquires a resistive component of an impedance between the output lines 22a and 22b via the AC voltage application circuit 63, the current detection circuit 64 (or the voltage detection circuit 61), and the impedance measuring unit 73, and acquires a resistive component of an impedance between the output liens 23a and 23b via the AC voltage application circuit 66, the current detection circuit 67 (or the voltage detection circuit 65), and the impedance measuring unit 75 by applying an AC voltage between the output lines 23a and 23b (S11).

Then, the ST separation determining unit 54 determines whether both the acquired two resistive components are equal to or greater than, for example, 5Ω (S12). When both the acquired two resistive components are less than, for example, 5Ω, the ST separation determining unit 54 determines that the output lines 22 and 23 and the solar cell strings 11 as two inspection objects are connected to each other and outputs information indicating the fact via the output unit 37 (S13). Then, the ST separation determining unit 54 causes the switch circuit 33 to switch from the second connection state to the original first connection state via the switching control unit 53 (S14) and then the inspection process is ended.

On the other hand, when both the acquired two resistive components are equal to or greater than, for example, 5 Ω, the PCS start determining unit 51 determines that the PCS 13 is not started, the PCS separation determining unit 52 determines that the output lines 22a and 23a of the inspection object are electrically separated from the PCS 13, and the ST separation determining unit 54 determines that the output lines 22 and 23 and the solar cell strings 11 as two inspection objects are electrically separated from each other. Accordingly, the ST separation determining unit 54 causes the switch circuit 33 to switch from the second connection state to the original first connection state via the switching control unit 53 (S15), and then the first inspection unit 42 and the second inspection unit 44 performs inspections of the output lines 22 and 23 and the solar cell strings 11 of the inspection objects (S16). Thereafter, the inspection process is ended.

[Second Embodiment]

Figure 6:
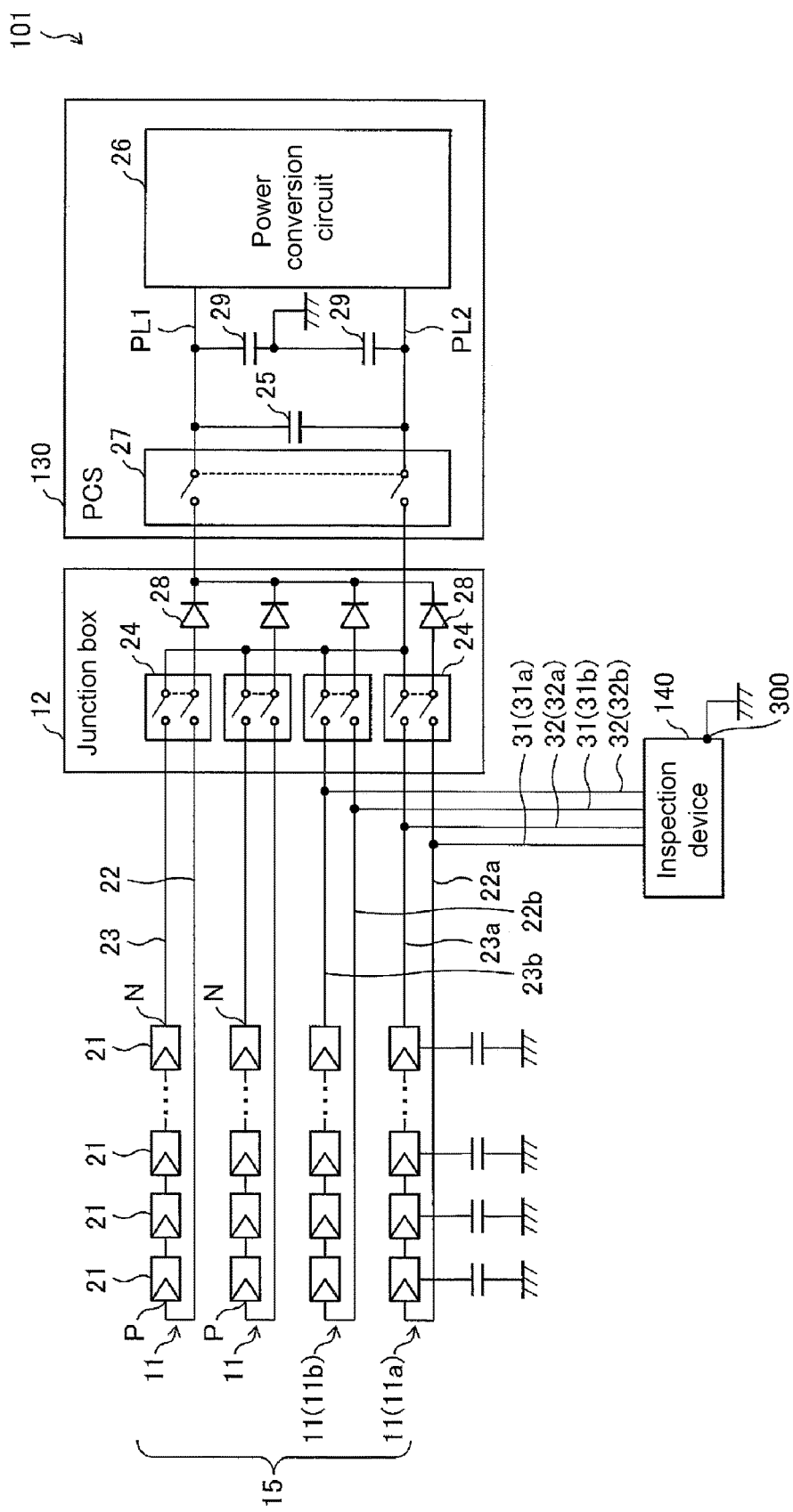
FIG. 6 is a circuit diagram schematically illustrating a configuration of a solar power generation system including an inspection device according to another embodiment of the invention.

FIG. 6 is a circuit diagram schematically illustrating a configuration of a solar power generation system including an inspection device according to another embodiment of the invention. A solar power generation system 101 according to this embodiment is different from the solar power generation system 1 illustrated in FIGS. 1 to 5, in that a PCS 130 is provided instead of the PCS 13 and an inspection device 140 is provided instead of the inspection device 14, and both solar power generation systems are equal to each other in the other elements. The PCS 130 according to this embodiment is different from the PCS 13 illustrated in FIG. 1, in that a Y capacitor 29 is provided, and both PCSs are the same as each other in the other elements.

The Y capacitor 29 is provided between power lines PL1 and PL2 and the ground in the PCS 130 in order to reduce switching noise in the PCS 130.

The inspection device 140 according to this embodiment is different from the inspection device 14 illustrated in FIG. 1, in that a grounding terminal 300 grounded to a chassis or the like is added and start and separation of the PCS 130 are confirmed using the probe 31b attached to the output line 22b connected to the P terminal of the solar cell string 11b and the grounding terminal 300, and both inspection devices are equal to each other in the other elements.

Specifically, the inspection device 140 measures a voltage between the probe 31b and the grounding terminal 300, and acquires a voltage of a frequency component (for example, 20 kHz) corresponding to the switching noise in the PCS 130 in the measured voltage. When the magnitude of the acquired voltage of the frequency component is equal to or greater than a predetermined value, it can be determined that the PCS 130 is connected to the output line 22b of the inspection object and the PCS 130 is started.

The inspection device 140 inspects a capacitance of the Y capacitor 29. Specifically, the inspection device 140 measures a capacitance between the probe 31b and the grounding terminal 300. When the output line 22b of the inspection object is connected to the PCS 130, the capacitance (about 100 nF) of the Y capacitor 29 is detected as the capacitance between the probe 31b and the grounding terminal 300. On the other hand, when the output line 22b of the inspection object is electrically separated from the PCS 130, a parasitic capacitance (about 5 nF) between the solar cell string 11b and the ground is detected as the capacitance between the probe 31b and the grounding terminal 300. Accordingly, the inspection device 140 can determine whether the output line 22b of the inspection object is electrically separated from the PCS 130 by measuring the capacitance between the probe 31b and the grounding terminal 300.

This inspection method of inspecting the capacitance of the Y capacitor 29 has many parts common to an inspection method of detecting a disconnection in a solar panel included in the solar cell module 21, which is performed later. Accordingly, it is possible to curb an increase in device scale or manufacturing cost of the inspection device 140 in order to determine whether the output line 22b of the inspection object is electrically separated from the PCS 130.

In this embodiment, the inspection device 140 measures an electrical signal between the probe 31b and the grounding terminal 300, but may measure an electrical signal between the probe 32b attached to the output line 23b connected to the N terminal of the solar cell string 11b and the grounding terminal 300. Since the switching noise is also superimposed on the electrical signal, it is possible to determine whether the output line 23b of the inspection object is connected to the PCS 130 and the PCS 130 is started.

When the output line 23b of the inspection object is connected to the PCS 130, the capacitance (about 100 nF) of the Y capacitor 29 is detected as the capacitance between the probe 32b and the grounding terminal 300. Accordingly, similarly to the case in which the capacitance between the probe 31b and the grounding terminal 300 is measured, the inspection device 140 can determine whether the output line 23b of the inspection object is electrically separated from the PCS 130 by measuring the capacitance between the probe 32b and the grounding terminal 300.

(Supplementary Note)

In the above-mentioned embodiments, the PCS start determining unit 51 and the PCS separation determining unit 52 use the measured values in the output lines 22a and 23a, but may use measured values in the output lines 22b and 23b. In this case, the PCS start determining unit 51 and the PCS separation determining unit 52 can be connected to the second circuit control unit 43 instead of the first circuit control unit 41.

In the above-mentioned embodiments, the inspection device 14 inspects two inspection objects, but may inspect three or more inspection objects. When the ST separation determining unit 54 is omitted, the inspection device 14 may inspect only one inspection object.

In the above-mentioned embodiments, the ST separation determining unit 54 uses the resistive component of the impedance between the output lines 22a and 22b and the resistive component of the impedance between the output liens 23a and 23b, but may use a potential difference between the output lines 22a and 22b and a potential difference between the output lines 23a and 23b. In this case, the ST separation determining unit 54 can acquire the potential difference between the output lines 22a and 22b and the potential difference between the output lines 23a and 23b via the voltage detection circuits 61 and 65 and can determine that the output lines 22 and 23 and the solar cell strings 11 as two inspection objects are electrically separated from each other when the absolute values of both the acquired potential differences are equal to or greater than, for example, 1 V.

In the above-mentioned embodiments, the invention is applied to a solar power generation system, but is not limited thereto. The invention may be applied to an arbitrary power supply system including a DC power source and a power converter that converts electric power supplied from the DC power source via a power line. Examples of the DC power source include, in addition to a solar power generation system, a fuel cell device that can acquire electric energy (DC power) using hydrogen fuel by an electrochemical reaction between hydrogen fuel and oxygen in the air and a power storage device such as a storage battery or a capacitor that stores electric energy.

In the above-mentioned embodiments, the switch circuit 24 is used, but the invention is not limited thereto. An arbitrary cutoff mechanism that can cut off an electrical connection between each solar cell string 11 and the solar power generation system 1 can be used. In the above-mentioned embodiments, the switch circuit 27 is used, but the invention is not limited thereto. An arbitrary cutoff mechanism that can cut off an electrical connection between the PCS 13 and the solar cell array 15 and the junction box 12 can be used. Examples of such a cutoff mechanism include attachment and detachment using a connector and attachment and detachment using a terminal block.

[Embodiment Using Software]

A control block (particularly, the control unit 36) of the inspection device 14 may be embodied by a logical circuit (hardware) which is formed in an integrated circuit (an IC chip) or may be embodied by software using a central processing unit (CPU).

In the latter, the inspection device 14 includes a CPU that execute commands of a program which is software for realizing the functions, a read only memory (ROM) or a storage device (which are referred to as a "recording medium") in which the program and various data are recorded in a computer (or CPU) readable manner, and a random access memory (RAM) that develops the program. By causing the computer (or the CPU) to read and execute the program from the recording medium, the object of the invention is achieved. As the recording medium, a "non-transitory material medium" such as a tape, a disk, a card, a semiconductor memory, or a programmable logical circuit can be used. The program may be supplied to the computer via an arbitrary transmission medium (such as a communication network or a broadcast wave) that can transmit the program. The invention may be embodied in the form of a data signal which is embedded in carrier waves in which the program is embodied by electronic transmission.

As described above, the inspection device according to an aspect of the invention is an inspection device that inspects a first power source-side circuit in a power supply system including the first power source-side circuit including a first DC power source that generates electric power or performs charging/discharging, a power converter that converts electric power supplied from the first power source-side circuit, and a first cutoff mechanism that cuts off electrical connection between the first power source-side circuit and the power converter, the inspection device including: a measurement unit that measures an impedance of the first power source-side circuit; and a first separation determining unit that determines whether the first power source-side circuit is electrically separated from the power converter by the first cutoff mechanism on the basis of a capacitive component of the impedance measured by the measurement unit.

In the power converter, a capacitor with a relatively large capacitance (for example, about 1 mF) is provided to stabilize electric power from the DC power source. On the other hand, a parasitic capacitance in the first power source-side circuit is relatively small and is, for example, about 50 nF at most in the case of a solar power generation system.

Therefore, according to this configuration, it is possible to measure an impedance of the first power source-side circuit and to determine whether the first power source-side circuit is electrically separated from the power converter on the basis of a capacitive component of the measured impedance by itself By selecting an appropriate frequency (for example, equal to or less than 1 kHz) and measuring an impedance relevant to the selected frequency, it is possible to reliably determine whether they are separated. The measured impedance may be between the positive terminal and the negative terminal of the DC power source, between the positive terminal of the DC power source and the ground, or between the negative terminal of the DC power source and the ground.

When it is intended to measure the impedance of the first power source-side circuit, a test signal of an AC voltage can be introduced into the first power source-side circuit and an AC current can be detected.

However, when the power converter is connected to the first power source-side circuit and the power converter is started, there is concern that switching noise in the power converter will be generated and the impedance will not be accurately measured.

Therefore, in the inspection device according to the aspect of the invention, it is preferable that the measurement unit further measure a magnitude of a predetermined frequency component in a AC voltage of the first power source-side circuit, wherein the inspection device further includes a start determining unit that determines whether the power converter is started from the magnitude of the frequency component measured by the measurement unit, and the first separation determining unit operates when the start determining unit determines that the power converter is not started.

In this case, by measuring the magnitude of a voltage of the predetermined frequency component corresponding to the switching noise, it is possible to determine whether the switching noise is generated and to determine whether the power converter is started by itself. By causing the first separation determining unit to operate when the power converter is not started, it is possible to accurately confirm whether the first power source-side circuit is electrically separated from the power converter by itself.

In the power supply system further including a second power source-side circuit including a second DC power source that generates electric power or performs charging/discharging and a second cutoff mechanism that cuts off an electrical connection between the second power source-side circuit and the power converter, when the two power source-side circuits (the first power source-side circuit and the second power source-side circuit) are connected to each other, the inspection device inspects the two power source-side circuits connected to each other as a whole and cannot individually inspect the two power source-side circuits.

Therefore, it is preferable that the inspection device according to the aspect of the invention inspects the first power source-side circuit and the second power source-side circuit in the power supply system, and the measurement unit further includes a second separation determining unit that determines whether the first power source-side circuit and the second power source-side circuit are electrically separated from each other. In this case, it is possible to determine whether the two power source-side circuits are electrically separated from each other by itself. It is also possible to individually inspect the two power source-side circuits. When it is intended to determine whether the first power source-side circuit and the second power source-side circuit are electrically separated from each other, for example, it can be checked whether one terminal of the first DC power source in the first power source-side circuit and one terminal or the other terminal of the second DC power source in the second power source-side circuit are short-circuited.

In the inspection device according to the aspect of the invention, it is preferable that the second separation determining unit operate when the first separation determining unit determines that the first power source-side circuit is electrically separated from the power converter. In this case, by causing the second separation determining unit to operate when the first power source-side circuit is electrically separated from the power converter, it is possible to accurately confirm whether the two power source-side circuits are electrically separated from each other.

The control method of the inspection device according to another aspect of the invention is a control method of an inspection device that inspects a first power source-side circuit in a power supply system including the first power source-side circuit including a first DC power source that generates electric power or performs charging/discharging, a power converter that converts the electric power supplied from the first power source-side circuit, and a first cutoff mechanism that cuts off electrical connection between the first power source-side circuit and the power converter, the control method including: a measurement step of measuring an impedance of the first power source-side circuit; and a first separation determining step of determining whether the first power source-side circuit is electrically separated from the power converter by the first cutoff mechanism on the basis of a capacitive component of the impedance measured by the measurement step.

According to this method, the same advantageous effects as in the inspection device can be achieved.

The inspection device according to an aspect of the invention may be embodied by a computer. In this case, a control program for an inspection device in which the inspection device is embodied by a computer by causing the computer to serve as the units of the inspection device and a computer-readable recording medium having the control program recorded thereon are included in the scope of the invention.

The invention is not limited to the above-mentioned embodiments, but can be modified in various forms within the scope described in the appended claims. An embodiment obtained by appropriately combining technical means described in the embodiments is included in the technical scope of the invention.

[REFERENCE SIGNS LIST]

1, 100, 101 Solar power generation system (power supply system)
11 Solar cell string (DC power source, power source-side circuit)
12 Junction box
13, 130 PCS (power converter)
14, 140 Inspection device
15 Solar cell array
21 Solar cell module
22, 23 Output line (power source-side circuit)
24 Switch circuit (first cutoff mechanism, second cutoff mechanism)
25 Large-capacitance capacitor
26, 260, 261 Power conversion circuit
27 Switch circuit (first cutoff mechanism)
28 Diode
29 Y capacitor
31, 32 Probe
33 Switch circuit
34 First inspection circuit
35 Second inspection circuit
36 Control unit
37 Output unit 41 First circuit control unit
42 first inspection unit
43 Second circuit control unit
44 Second inspection unit
51 PCS start determining unit (start determining unit)
52 PCS separation determining unit (first separation determining unit)
53 Switching control unit
54 ST Separation determining unit (second separation determining unit)
61, 65 Voltage detection circuit
62 BPF
63, 66 AC Voltage application circuit
64, 67 Current detection circuit
71 Voltage acquiring unit
72, 74 Voltage application instructing unit
73, 75 Impedance measuring unit (measurement unit)
300 Ground terminal

What is claimed is:

1. An inspection device that inspects a first power source-side circuit in a power supply system which comprises the first power source-side circuit, a power converter and a first switch circuit, wherein the first power source-side circuit comprises a first DC power source that generates electric power and performs charging or discharging, the power converter converts the electric power supplied from the first power source-side circuit, and the first switch circuit cuts off electrical connection between the first power source-side circuit and the power converter, the inspection device comprising:
 a measurement unit that measures an impedance of the first power source-side circuit; and
 a first separation determining unit that determines whether the first power source-side circuit is electrically separated from the power converter by the first switch circuit on the basis of a capacitive component of the impedance measured by the measurement unit, wherein when the capacitive component of the impedance is less than a preset value, the first separation determining unit determines that the first power source-side circuit is electrically separated from the power converter.

2. The inspection device according to claim 1, wherein the measurement unit further measures a magnitude of a predetermined frequency component in a voltage of the first power source-side circuit,
 wherein the inspection device further comprises a start determining unit that determines whether the power converter has started from the magnitude of the frequency component measured by the measurement unit, and
 wherein the first separation determining unit operates when the start determining unit determines that the power converter has not started.

3. The inspection device according to claim 1, wherein the inspection device inspects the first power source-side circuit and a second power source-side circuit in the power supply system which further comprises the second power source-side circuit, wherein the second power source-side circuit comprises a second DC power source that generates electric power and performs charging or discharging, and a second switch circuit cuts off electrical connection between the second power source-side circuit and the power converter, and
 wherein the measurement unit further includes a second separation determining unit that determines whether the first power source-side circuit and the second power source-side circuit are electrically separated from each other.

4. The inspection device according to claim 3, wherein the second separation determining unit operates when the first separation determining unit determines that the first power source-side circuit is electrically separated from the power converter.

5. A non-transitory computer readable storage medium, which stores a control program causing a computer to serve as the inspection device according to claim 1, wherein the control program causes the computer to function as the units.

6. A control method performed by an inspection device that inspects a first power source-side circuit in a power supply system which comprises the first power source-side circuit, a power converter and a first switch circuit, wherein the first power source-side circuit comprises a first DC power source that generates electric power and performs charging or discharging, the power converter converts the electric power supplied from the first power source-side circuit, and the first switch circuit cuts off electrical connection between the first power source-side circuit and the power converter, the control method comprising:
 a measurement step of measuring an impedance of the first power source-side circuit; and
 a first separation determining step of determining whether the first power source-side circuit is electrically separated from the power converter by the first switch circuit on the basis of a capacitive component of the impedance measured by the measurement step, wherein when the capacitive component of the impedance is less than a preset value, the first power source-side circuit is electrically separated from the power converter is determined.

7. The inspection device according to claim 2, wherein the inspection device inspects the first power source-side circuit and a second power source-side circuit in the power supply system which further comprises the second power source-side circuit, wherein the second power source-side circuit comprises a second DC power source that generates electric power and performs charging or discharging and a second switch circuit that cuts off electrical connection between the second power source-side circuit and the power converter, and
 wherein the measurement unit further includes a second separation determining unit that determines whether the first power source-side circuit and the second power source-side circuit are electrically separated from each other.

8. A non-transitory computer readable storage medium, which stores a control program causing a computer to serve as the inspection device according to claim 2, wherein the control program causes the computer to function as the units.

9. A non-transitory computer readable storage medium, which stores a control program causing a computer to serve as the inspection device according to claim 3, wherein the control program causes the computer to function as the units.

10. A non-transitory computer readable storage medium, which stores a control program causing a computer to serve as the inspection device according to claim 4, wherein the control program causes the computer to function as the units.

* * * * *